June 24, 1958 E. D. DAWSON 2,839,936

UNI-CONTROL TUNING MECHANISM FOR MULTI-BAND SIGNAL RECEIVERS AND THE LIKE

Filed Feb. 27, 1952 2 Sheets-Sheet 1

INVENTOR
Ernest D. Dawson
BY H. O. Muston
ATTORNEY

INVENTOR
Ernest D. Dawson
BY H. L. Newston
ATTORNEY

United States Patent Office 2,839,936

Patented June 24, 1958

2,839,936

UNI-CONTROL TUNING MECHANISM FOR MULTI-BAND SIGNAL RECEIVERS AND THE LIKE

Ernest D. Dawson, Upper Darby, Pa., assignor to Radio Corporation of America, a corporation of Delaware Application February 27, 1952, Serial No. 273,717

10 Claims. (Cl. 74—10.54)

Figures 1, 2, 3:
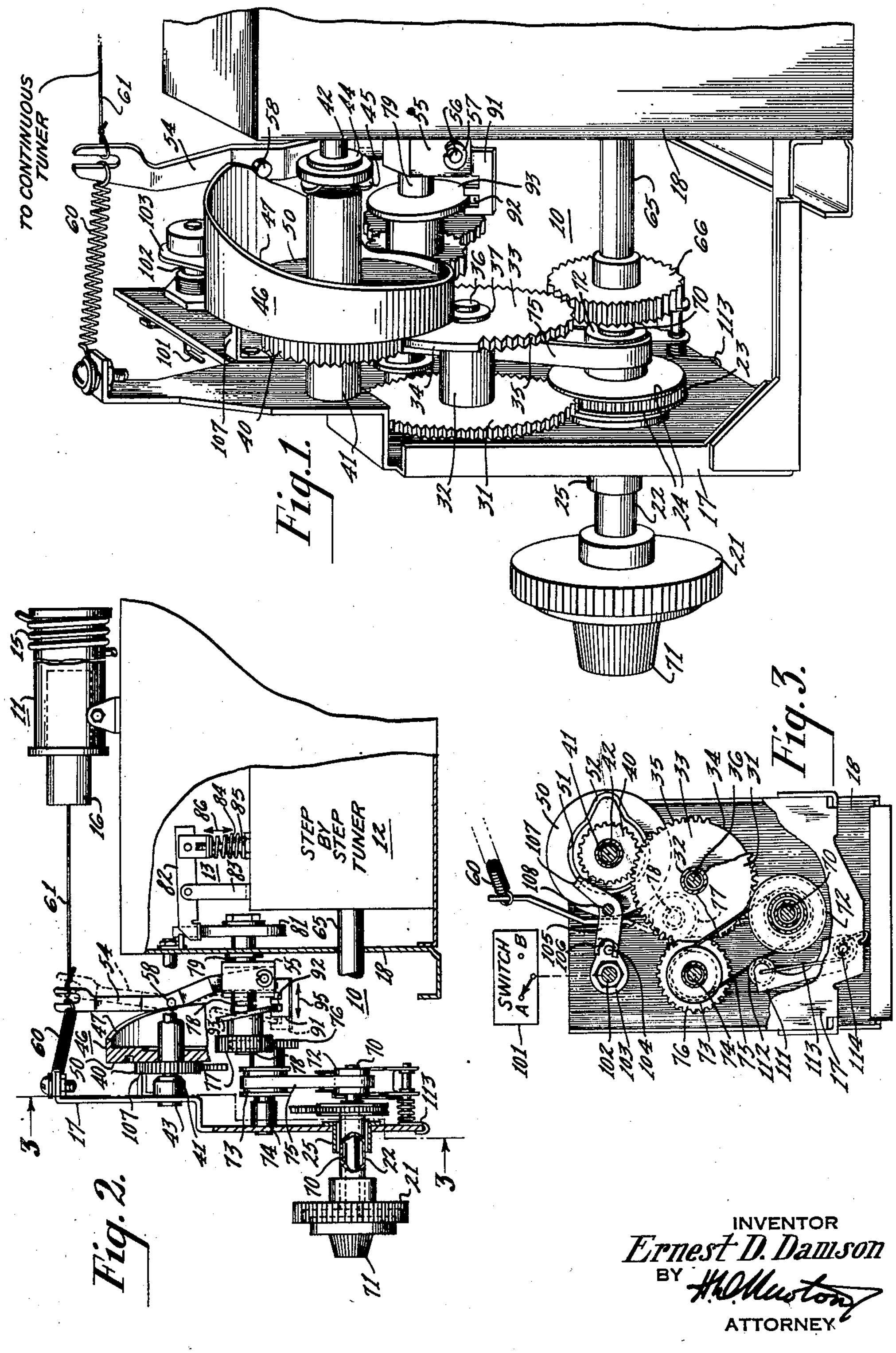

This invention relates to manual control mechanisms for indexing apparatus and more particularly to manual tuning drive mechanisms of the type used in radio and television receivers for example, to adjust the variable tuning elements thereof, such as ganged variable capacitors and/or groups of selectable inductors, and has for a primary object to provide an improved manual tuning control system or mechanism for sequentially and accurately controlling a plurality of radio signal selecting elements in a system of the type referred to, through the medium of a single tuning shaft.

Radio signal receiving equipment and, in particular, television receivers are generally difficult to tune to any particular television channel due to the fact that a large frequency range usually has to be covered by the tuning system and a small displacement of the tuning control means therefore, may result in a wide frequency change of signal selection covering several channels. It has therefore been necessary to provide relatively slow motion drive or vernier control means between the main operating control and the tuning elements actuated thereby to enable fine tuning to a particular channel.

Recently the ultra high frequency (U. H. F.) band from 470 megacycles (mc.) to 890 mc. has been tentatively allocated for broadcasting television signals in addition to the presently assigned very high frequency (V. H. F.) band in the 54 to 216 mc. range. It is desirable to enable a receiver having a V. H. F. tuner to cover the U. H. F. band by providing the receiver with a U. H. F. adaptor or tuner capable of covering the U. H. F. band. Because of the tuning difficulties hereinbefore mentioned, a main operating or tuning control means and a vernier operating or tuning control means is required for each tuner. In addition, it is desirable to use separate receiving antennas for each band, and further, in order to prevent undue expenditure of power, it is desirable to disable or disconnect one of the tuners while the other is in use.

It is therefore an additional object of the invention to provide a manually operable tuning mechanism for high frequency signal circuits which may be linked to the main movable tuning elements of a pair of circuit tuners remote from a common driving member therefor, and which further provides antenna and power supply switching means.

Another object of this invention is to provide a tuning mechanism for high frequency signal circuits which readily provides tuning movement of a variable tuning device which must cover a relatively wide frequency spectrum, while at the same time providing vernier adjustment of the device or similar circuit elements for any selected narrow signal channel within said spectrum.

It is a further object of this invention to provide a tuning mechanism which provides sequential tuning movement over the frequency spectrum including a pair of distinct and separated frequency bands and which imparts such movement through the rotation in either direction of a single main tuning shaft.

Other objects of the invention will become apparent from the detailed description contained in the specification when considered in conjunction with the accompanying drawing.

A tuning control system in accordance with the invention, includes a single tuning mechanism for rapidly tuning selectively one or the other of two receiver tuners and for vernier tuning over any selected, relatively narrow, channel within the frequency band of either of said tuners. Such a mechanism is useful in selectively tuning radio receivers incorporating two tuners to cover frequency spectrum, which includes for example the television broadcast band presently assigned in the United States in the 54 to 216 mc. range and the tentatively allocated television broadcast bands in the 470 to 890 mc. range. With the tuning mechanism of the present invention, a particular channel may be selected in either of the above mentioned ranges by the adjustment of a single main tuning control shaft, and the desired channel or band within the range may be adjusted by means of a separate vernier tuning control shaft which may be conjointly operative to control the same tuning means. The main tuning control shaft may be linked or coupled for conjoint operation with an antenna changing and power supply switch means for the tuners. All may then be actuated by the main tuning control shaft.

Figure 4:
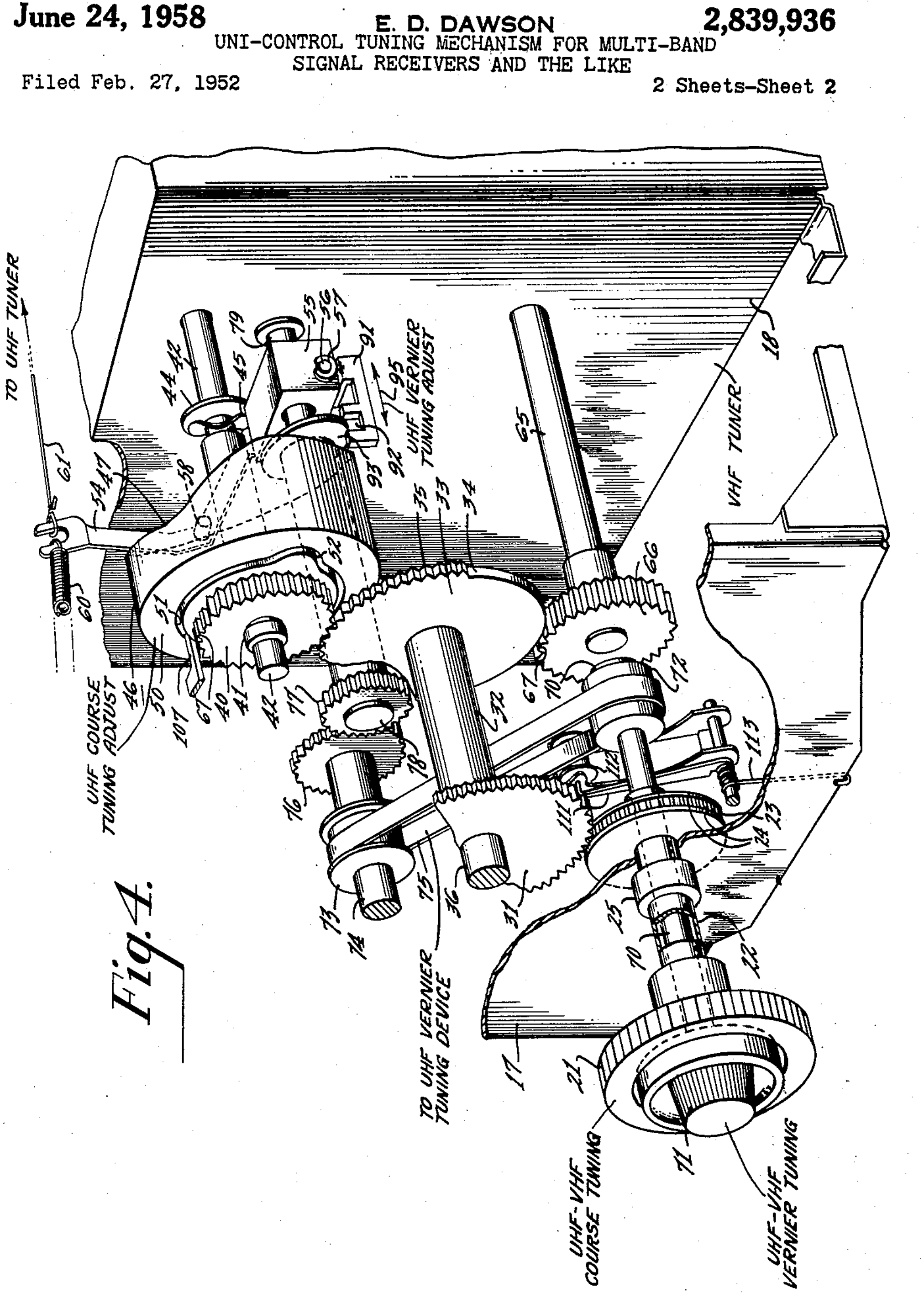

In the drawings,

Figure 1 is a perspective side view of a tuning mechanism in accordance with the invention, Figure 2 is a full side view on a reduced scale and partly in cross-section, of the tuning mechanism of Figure 1, with certain portions broken away to show further details of the vernier tuning elements thereof in accordance with the invention;

Figure 3 is a front elevational view, on the same scale as Figure 2, and partly in section, of the tuning mechanism of Figure 1 in accordance with the invention, the section being taken in the direction of the arrows 3—3 of Figure 2, and Figure 4 is a frontal view in perspective and on the same scale as Figure 1, of a portion of the tuning mechanism of Figure 1, in accordance with the invention, showing further operational details.

Referring to the drawings, in which like reference characters are applied to like parts throughout the various figures, a tuning mechanism 10 is connected alternately or sequentially to operate the movable tuning element or elements of a pair of high frequency signal tuning systems or tuners 11 and 12, represented diagrammatically in Figure 2, through desired ranges of movement. In the present example, the tuning mechanism is connected to the tuner 11 which may be of the continuously-variable permeability-tuned inductor type as indicated and to the tuner 12 which may be of the conventional step-by-step television turret-type, and may be assumed to be of this type by way of example. A fine tuning mechanism or linkage 13 for the step-by-step tuner may be arranged to actuate a variable capacitor or an inductor tuning core within the step-by-step tuner 12 to provide fine tuning within a particular channel in any desired and well known manner.

In accordance with the invention, the tuning mechanism 10 is provided with a front frame or support member 17 and a rear frame or support member 18 between or in which various fixed rotatable shafts are supported or journalled, as will hereinafter be more fully described.

The portion of the tuning mechanism 10 which operates the continuous tuner 11 will now be described. As shown in Figure 2, the main tuning element of the continuous tuner may be a tunable inductor 15, the inductance of which is varied by means of a tuning core 16 which is movable with respect to the inductor 15.

A main tuning drive control knob 21 is connected by means of a hollow main drive shaft 22 to a driver pinion 23 having guide plates 24 on either side thereof. A hollow bushing or sleeve 25 affixed to the frame member 17 concentrically encloses a portion of the shaft 22 thereby providing a support for the shaft.

A main follower gear 31 is in continual mesh with the driver pinion 23, and is maintained in mesh with pinion 23 by means of the guide plates 24. The follower gear 31 is coupled by means of a hollow axile 32 to a main tuning or driver segment gear 33. Segment gear 33 has a substantially smooth portion 34 over about a half of its periphery and a toothed portion 35 over the remainder of its periphery. This is most clearly illustrated in Figure 3.

The gear unit including the follower gear 31, the hollow axile 32 and the segment gear 33 is rotatably on a shaft 36 which extends inwardly from the frame member 17 and which is rigidly affixed thereto. A collar or lock washer 37 is provided at the end of the shaft 36 to limit axial motion of the gear unit.

A tuning follower pinion 40 is arranged adjacent the segment gear 33 and is adapted to mesh with the toothed portion 35 of the segment gear. The follower pinion 40 is mounted on a hollow axial sleeve 41 which freely rotates about a cam shaft 42. It is apparent that the shaft 42 may be keyed to pinion 40 and be rotatable therewith for the purpose of driving an additional tuning control means. The shaft 42 is therefore secured or journalled at one end by a boss or bearing 43 on the front frame member 17, and is supported or journalled at the other end by the rear frame member 18. At the end of the cam shaft adjacent the rear frame member, there is provided a retaining collar 44 and a spring washer 45 which urges the axial sleeve 41 toward the front frame 17, thereby limiting the axial movement of the sleeve and maintaining the follower pinion 40 in contact with the segment gear 33.

Also mounted on the sleeve 41 and rotatable therewith is a spiral or cylindrical cam 46. The length of the cam body gradually varies from a minimum to a maximum thereby providing the spiral camming edge 47.

The cylindrical cam 46 is provided with an end plate or disk 50 having a camming groove therein including a circular portion 51 and a lobe portion 52. This is clearly shown in Figure 3 and its purpose and operation will be more fully explained hereinafter. The camming groove 51—52 may be cut into the end plate of the cylindrical cam, or the cam, end plate, and camming groove may be die-cast as a unit in a single operation.

A tuning lever 54 is pivotally connected to a carriage 55 by means of a pivot pin 56 and a lock washer 57. A cam follower stud 58 is provided on the tuning lever and is maintained in contact with the cylindrical cam 46 by a spring 60 connected between the free end of the tuning lever 54 and the front frame member 17.

The tuning core 16 of the continuous tuner 11 is attached to the tuning lever 54 by means of a connecting rod or semi-flexible wire 61 or some other linkage by means of which a connection of any desired length may be provided. Thus by that part of the tuning mechanism including the tuning lever 54, the cylindrical cam 46, and the gear train including the follower pinion 40, the segment gear 33, the follower gear 31, and the driver pinion 23, the rotation or adjustment of the control knob 21 is adapted to vary the tuning of the continuous tuner 11 over its entire frequency range.

It is to be noted that follower pinion 40 is actuated by the segment gear 33 only during that part of the cycle of segment gear 33 in which the toothed portion of the segment gear engages the teeth of the follower pinion 40. By providing the follower pinion with a number of teeth equal to the number of teeth on the segment gear, the follower pinion will make one complete rotation, or a rotation of 360 degrees, for a 180 degree rotation of the segment gear. During the next 180 degree rotation of the segment gear, the pinion follower will not rotate due to the fact that the smooth portion of the segment gear periphery is adjacent the teeth of the follower pinion. As a result, the continuous tuner is adjusted over its entire tuning range during that time in which the teeth of the segment gear 33 and the teeth of the follower pinion 40 are meshed.

Certain of the elements which actuate the continuous tuner 11, contribute to the adjustment of the step-by-step tuner diagrammatically indicated at 12 as will now be explained.

The step-by-step tuner may be one of the well known V. H. F. turret type television tuners having a plurality of preadjusted tuning strips adapted to be selectively switched into circuit with a television receiver. The tuning shaft 65 of the step-by-step tuner carries the follower pinion 66 which may be coupled thereto by a set screw. Rotation of the pinion 66 causes the tuning shaft 65 to rotate whereby the step-by-step tuner is selectively tuned over its frequency range.

The step-by-step follower pinion 66 arranged adjacent the segment gear 33 and is adapted to mesh with the toothed portion 35 of the segment gear in the same manner as the continuous tuner follower pinion 40. Thus rotation of the control knob 21 is transmitted to the step-by-step tuning shaft 65 by means of the main drive shaft 22, driver pinion 23, follower gear 31, axile 32, segment gear 33, and the follower pinion 66.

It is now apparent that the toothed portion 35 of the segment gear is adapted to alternately or sequentially mesh with the pinions 40, 66. In Figure 1, the teeth of the segment gear 33 are shown engaged with the pinion follower 66, and in Figure 3, the segment gear teeth are shown meshed with the teeth of the pinion follower 40.

It is further apparent that through a portion, determined by the peripheral length of the toothed portion 35, of one cycle or one complete rotation of the segment gear, motion is imparted to one pinion follower, for example pinion 40, during which time the other pinion follower 66 is effectively disengaged from the segment gear and not rotated thereby. During the remainder of the tuning cycle, while knob 21 is rotated in the same direction, the segment gear is meshed with and imparts motion to the previously idle pinion 66 during which time the pinion 40 is effectively disengaged from the segment gear.

A further feature in accordance with the invention is illustrated in Figure 4. When either pinion 40 or pinion 66 is effectively disengaged from the segment gear as hereinbefore explained, the disengaged gear is locked against rotation. This locking feature is provided by cutting away a portion of a number of teeth on each pinion as indicated at 67. The cut or detent is arcuate in shape and has a radius equal to the pitch of the segment gear 33.

In assembling the tuning mechanism, the cut away portions 67 are arranged adjacent the end teeth of the toothed portion 35 of the segment gear. Upon rotation of the segment gear 33, the teeth of the segment gear will mesh with the teeth of one of the pinions depending upon the direction of rotation of the segment gear. The smooth portion 34 of the segment gear will slide within the arcuate cut of that pinion which is not meshed with the segment gear. The pinion gear not meshed with the segment gear is thereby locked against rotation during the time the smooth portion 34 of the segment gear is within the arcuate cut 67 of the pinion. This is apparent from the fact that in order for the locked pinion to rotate, its teeth must move within the radius or pitch circle of the segment gear, and this is obviously not physically possible.

It is to be noted that the direction and extent of rotation of the control knob, segment gear, and follower pinions is in no way limited. That is, the control knob 21 may be continually turned in either direction to accomplish tuning.

Attention is now directed more particularly to Figure 2 wherein elements of the main tuning gear trains have been cut away to more clearly illustrate the structure and operation of the vernier or fine tuning mechanism for the step-by-step tuner and to Figure 4.

A vernier drive shaft 70 is concentrically arranged within the hollow main drive shaft 22. A vernier tuning control knob 71 is coupled to one end of the vernier shaft, and a pulley 72 is coupled to the other end of the vernier shaft. A second pulley 73 is carried by a shaft 74 which is affixed to the front frame member 17. A belt 75 engages both pulleys and transmits motion from one pulley to the other.

Connected to pulley 73 and rotatable therewith is a vernier or fine tuning driver gear 76 which may be of the split anti-backlash type to provide a more sensitive adjustment of the fine tuning mechanism. A vernier follower gear 77 which engages gear 76 is connected to a vernier coupling shaft 78 journalled within a hollow sleeve 79 extending outwardly from the rear frame member 18.

At one end of the shaft 78 there is provided an eccentric wheel or cam 81. A follower rocker arm 82, pivoted on a vertical leg 83, is arranged to follow the movement of the cam 81. The rocker arm 82 is maintained in contact with the cam 81 by means of the spring 84. As the cam 81 rotates upon rotation of the vernier control knob 71, the rocker arm 82 follows the cam 81 and imparts a vertical movement to the tuning element 85 as indicated by the arrow 86. The tuning element 85 may for example be a movable tuning core for an inductor or it may be the movable electrode of a variable capacitor. In this manner, fine tuning of the step-by-step tuner 12 is accomplished.

Fine tuning of the continuous tuner 11 is accomplished by causing the lever arm 54 to pivot about the follower stud 58. This is accomplished in the following manner. The fine tuning carriage 55 is slidably mounted on the hollow sleeve 79. An arm 91, attached to the carriage 55 is provided with a slot 92 for engaging the periphery of a spiral or warped disk 93 which is mounted intermediate the ends of the vernier coupling shaft 78. When the fine tuning knob 71 is rotated, the disk 93 rotates and causes the arm 91 and carriage 55 to slide back and forth on the carriage sleeve 79 as indicated by the arrow 95. The tuning lever arm 54, being pivotally connected to the carriage 55 is thus caused to pivot about the follower stud 58 and vernier movement of the lever arm is thereby attained. It is to be noted that the tuning lever 54 functions as a third class lever, pivoted about a point on the carriage 55, when actuated by the main tuning control knob 21, and functions as a first class lever, pivoted about the follower stud 58, when actuated by the vernier control knob 71.

In Figure 3 there is illustrated another feature of the invention. A two position, multi-contact switch diagrammatically illustrated at 101 is provided with a switch shaft 102 which carries a hub 103, having affixed thereto a stud 104. A rocker arm 105 having a forked end 106 which engages stud 104, is provided with a relatively narrow finger portion 107 which extends normal to the rocker arm and engages the camming groove 51, 52. A support pivot 108 extending from the frame member 17 is provided for the rocker arm.

With the switch in position A as indicated, an antenna and power supply, not shown, are connected to the U. H. F. tuner circuit.

As hereinbefore stated, when the main tuning control knob 21 is rotated, the segment gear 33 sequentially actuates the follower pinions 40 and 66. With the switch in position A, the toothed portion 35 of the segment gear 33 is meshed with the pinion 40 and the U. H. F. tuner is thereby adjusted through its frequency range. During the period in which the U. H. F. tuner 11 is operating, the finger portion 107 of the rocker arm engages the circular portion 51 of the camming groove and is thereby fixed in position at a point from the center of the cam shaft 42 a distance equal to the radius of the circular portion 51 of the camming groove. As the camming groove is further rotated by continued rotation of the control knob 21, the lobe portion 52 contacts the rocker arm finger 107 and urges the finger in a direction away from the cam shaft due to the effective increase in radius of the camming groove. The forked portion 106 of the rocker arm is thereby rocked downward, rotating the switch shaft 102 and changing the switch position from A to B. With the switch in position B, the power supply is switched from the U. H. F. tuner 11 to the V. H. F. tuner 12 and another antenna is connected to the V. H. F. tuner.

At this point in the operation of the tuning mechanism the toothed portion of the segment gear 33 is disengaged from the pinion 40 and meshes with the pinion 66 whereby the V. H. F. tuner is stepped through its tuning range. Since pinion 40 is effectively disengaged from the tuning mechanism, the camming groove 51, 52 is maintained stationary and the switch remains in position B during that time in which the V. H. F. tuner 12 is energized.

A belt tensioning means 111 comprising a belt guide roller 112 and spring 113 is provided for maintaining proper tension on the belt 75. A shaft 114 extending from the frame member 17 provides a support for the tensioning means 111.

From the foregoing description, it is evident that the invention provides a simple tuning mechanism for operating a pair of radio tuners from a common driving member. It is further evident that the tuning mechanism in accordance with the invention comprises two main tuning gear trains adapted to be alternately sequentially actuated by the common driving member and two vernier or fine tuning linkages which are simultaneously actuated by a single vernier driving member thus providing through a single pair of tuning knobs, tuning movement over a large frequency spectrum, while at the same time providing vernier movement in any narrow selected channel within the spectrum.

What is claimed is:

1. A manual control mechanism for driving a pair of high frequency signal tuners in sequence comprising in combination, a main tuning control shaft, a vernier tuning drive shaft, a main tuning control means for each of said high frequency tuners, a mechanical linkage including a driver segment gear having a smooth portion over part of its periphery and having a toothed portion over the remainder of its periphery coupling one of said main control means to said shaft during a portion of the rotation of said segment gear, and a further mechanical linkage including said segment gear coupling the other of said main control means to said shaft during a further portion of the rotation of said segment gear, a vernier coupling shaft, a vernier tuning control means for each of said tuners actuated by said coupling shaft, and a mechanical linkage connecting said vernier drive shaft to said coupling shaft.

2. In a manual control mechanism for driving a pair of high frequency signal tuners in sequence, the combination as defined in claim 1 wherein said mechanical linkages each include a pinion follower to mesh sequentially with said driver segment gear, and each of said pinion followers carries a number of teeth equal to the number of teeth on said segment gear.

3. A mechanism for selectively actuating a pair of high frequency signal tuners comprising in combination, a main tuning drive shaft, a vernier tuning drive shaft, said shafts being disposed in concentric relation one with respect to the other, a main tuning control means for each of said tuners, a gear train including a driver segment gear having a smooth portion over part of its periphery and having a toothed portion over the remainder of its periphery coupling one of said control means to said main drive shaft during a portion of the rotation of said segment gear, a further gear train including said segment gear coupling the other of said control means to said drive shaft during a further portion of the rotation of said segment gear, a vernier coupling shaft, a fine tuning control means for each of said tuners actuated by said coupling shaft, and a mechanical linkage connecting said vernier drive shaft to said coupling shaft.

4. A vernier tuning drive mechanism for actuating tuning elements of a continuous radio tuner and a step-by-step radio tuner comprising in combination, a vernier tuning drive shaft, a vernier coupling shaft, a fine tuning carriage slidably mounted on said coupling shaft, a lever having one end thereof pivotally connected to said carriage, a mechanical linkage between the other end of said lever and the tuning element for said continuous tuner, a pivot mounted intermediate the ends of said lever, a mechanical linkage including a belt driven portion connecting said coupling shaft to said drive shaft, a vernier tuning cam secured to said coupling shaft, follower means engaging said cam and linked to said tuning element of said step-by-step tuner, a warped disk secured to said coupling shaft intermediate the ends thereof, and an arm affixed to said fine tuning carriage and having a slot therein engaging the periphery of said warped disk whereby rotation of said disk imparts a linear reciprocating motion to said carriage.

5. A drive mechanism for manually adjusting the tuning elements of a continuous high frequency signal tuner and of a step-by-step high frequency signal tuner comprising in combination, a main tuning drive shaft, a vernier tuning drive shaft, said shafts being disposed in concentric relation one with respect to the other, a driver pinion secured to said main drive shaft, a main follower gear continually meshed with said driver pinion and fixed to a segment driver gear having a smooth portion over approximately half of its periphery and having a toothed portion over the remainder of its periphery, a first pinion follower actuated by the toothed portion of said segment gear, a spiral cam rigidly coupled to said first pinion follower, a fixed support for said cam and first pinion follower, a vernier coupling shaft disposed parallel to said vernier tuning shaft, a fine tuning carriage slidably mounted on said coupling shaft, a lever pivotally mounted to said carriage, a cam follower stud provided on said lever spring biased into engagement with said spiral cam whereby said lever follows the movement of said cam, a mechanical linkage between said lever and said tuning element of said continuous tuner; a second pinion follower actuated by the toothed portion of said segment gear, coupling means between said second pinion follower and said tuning element of said step-by-step tuner, a mechanical linkage including a belt driven portion connecting said coupling shaft to said vernier tuning drive shaft, a vernier tuning cam secured to said coupling shaft, fine tuning means for said step-by-step tuner, follower means for said vernier tuning cam engaging said fine tuning means, a warped disk secured to said coupling shaft, and an arm affixed to said fine tuning carriage and having a slot therein engaging the periphery of said warped disk whereby rotation of said disk imparts a reciprocating motion to said carriage.

6. In a drive mechanism for manually adjusting the tuning elements of a continuous high frequency signal tuner and of a step-by-step high frequency signal tuner, the combination as defined in claim 5 wherein each of said pinion followers has a number of teeth equal to the number of teeth in said toothed portion of said segment gear.

7. The combination as defined in claim 6 wherein a portion of the teeth of each of said pinion followers is cut away to provide a detent in the periphery of each of said pinion followers, said detent being arcuate in shape and having a radius equal to the radius of the pitch circle of said segment gear.

8. The combination as defined in claim 5 wherein said spiral cam includes a cylindrical body provided with a camming groove, and wherein a cam follower rocker arm is provided engaging said groove, a multiple contact switch, and a mechanical linkage between said rocker arm and said switch.

9. In a manual control mechanism for driving a pair of high frequency signal tuners in sequence, a manual vernier control mechanism for adjusting the tuning of the fine tuning elements of each of said pair of high frequency signal tuners over a relatively narrow frequency band, comprising in combination, a vernier drive shaft, driving means coupled to one end of said shaft, a mechanical linkage coupled to the other end of said shaft and adapted to adjust a fine tuning element of one of said tuners, a carriage slidably mounted on said drive shaft, an arm having a slot therein provided on said carriage, a lever arm pivotally mounted on said carriage and adapted to be further pivoted about a point intermediate the ends of said lever arm, and a warped disk affixed to said drive shaft and engaging said slot whereby rotation of said disk imparts a linear motion to said carriage thereby causing said lever to pivot about said point.

10. A vernier drive mechanism for actuating the tuning elements of a continuously variable radio tuner and a step by step radio tuner comprising the combination of a vernier tuning drive shaft, a vernier tuning cam mechanism connected to said vernier drive shaft, follower means engaging said cam and linked to actuate a tuning element in said step by step tuner, a lever connected to the tuning element of said continuous tuner, means mechanically coupling said lever to said vernier drive shaft to move said lever and the tuning element of said continuous tuner over a limited range in response to rotation of said tunable vernier drive shaft, a main tuning control drive shaft, means mechanically coupling said main tuning control shaft to said lever to move said lever and the tuning element of said continuous tuner over a relatively greater range than the range provided by said vernier drive shaft in response to rotation of said main tuning control shaft.

References Cited in the file of this patent

UNITED STATES PATENTS

| | | |
|---|---|---|
| 1,643,782 | Loewe | Sept. 27, 1927 |
| 1,748,390 | Otto | Feb. 25, 1930 |
| 1,765,587 | Howard | June 24, 1930 |
| 2,551,228 | Achenbach | May 1, 1951 |
| 2,558,454 | Nienaber | June 26, 1951 |
| 2,584,120 | Fyler | Feb. 5, 1952 |
| 2,665,377 | Krepps | Jan. 5, 1954 |

FOREIGN PATENTS

| | | |
|---|---|---|
| 326,833 | Italy | June 22, 1935 |